United States Patent [19]

Nagaune et al.

[11] Patent Number: 5,373,105
[45] Date of Patent: Dec. 13, 1994

[54] TERMINALS FOR A RESIN-SEALED SEMICONDUCTOR DEVICE

[75] Inventors: Fumio Nagaune; Hiraoki Matsushita, both of Kawasaki, Japan

[73] Assignee: Fuji Electric Co., Ltd., Kawasaki, Japan

[21] Appl. No.: 130,714

[22] Filed: Oct. 4, 1993

[30] Foreign Application Priority Data

Oct. 5, 1992 [JP] Japan .................. 4-265222

[51] Int. Cl.⁵ .................................... H01L 23/28
[52] U.S. Cl. .................... 174/52.2; 257/693; 429/170
[58] Field of Search .............. 174/52.2; 81/168; 429/121, 178, 179, 180, 181, 182, 183, 184, 185, 170; 257/692, 693, 787

[56] References Cited

U.S. PATENT DOCUMENTS

| | | | |
|---|---|---|---|
| 3,581,266 | 5/1971 | Weyenberg | 338/253 |
| 3,648,337 | 3/1972 | Greskamp et al. | 174/52.2 X |
| 3,711,752 | 1/1973 | Nier | 257/674 |
| 4,172,272 | 10/1979 | Schneider | 361/717 |
| 4,443,655 | 4/1984 | Van Dyk Soerewyn | 174/52.2 |
| 4,538,168 | 8/1985 | Van Dyk Soerewyn | 257/693 |
| 4,694,322 | 9/1987 | Sakurai et al. | 257/785 |
| 4,876,677 | 10/1989 | Moriya | 368/87 |
| 5,090,919 | 2/1992 | Tsuji | 174/52.2 X |
| 5,155,660 | 10/1992 | Yamada et al. | 361/717 |
| 5,281,493 | 1/1994 | Jones | 429/179 |

*Primary Examiner*—Leo P. Picard
*Assistant Examiner*—Christopher Horgan
*Attorney, Agent, or Firm*—Kanesaka & Takeuchi

[57] ABSTRACT

A terminal structure for a resin-sealed semiconductor device is formed of a circuit assembly, an outer casing for housing the circuit assembly therein and having a recess for retaining a terminal nut therein, molding resin filled in the outer casing to seal the circuit assembly, and an externally drawn terminal connected to the circuit assembly and extending outwardly through the outer casing. The externally drawn terminal has an external wire connecting portion disposed outside the lid. An anchor or a fixing device is attached to the external wire connecting portion so that the external wire connecting portion is fixed to the casing by two points.

10 Claims, 6 Drawing Sheets

TERMINALS FOR A RESIN-SEALED SEMICONDUCTOR DEVICE

BACKGROUND OF THE INVENTION AND RELATED ART STATEMENT

The present invention relates to a terminal structure for a resin-sealed semiconductor device, such as a diode, thyristor or transistor module.

FIGS. 9(a)–9(c) and 10 show a conventional resin-sealed semiconductor device and the related terminal structure. In the figures, the semiconductor device includes a heat dissipating metal base (1), an insulation substrate (2), a semiconductor chip (3), an externally drawn terminal (4), an outer casing (5) made of resin, sealing module resin (6), such as epoxy resin, for filling in the casing, and a terminal nut (7) mounted in a recess on top of the outer casing (5).

Figure 9A:
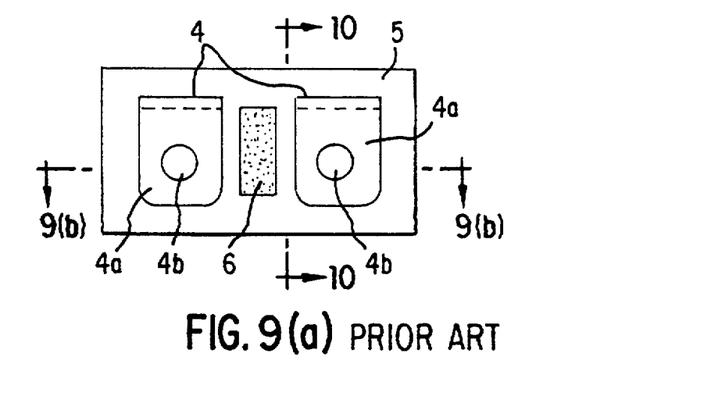
FIG. 9(a) is a plan view of a conventional resin-sealed semiconductor device.
Figure 9B:
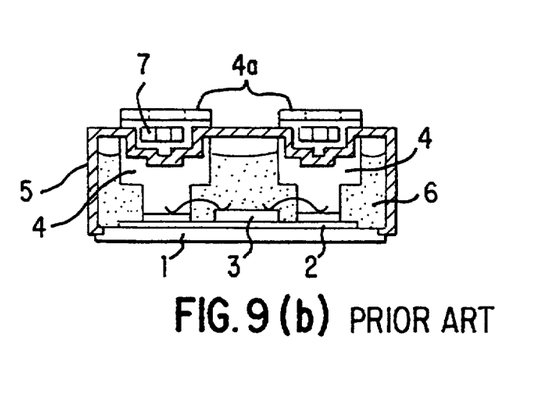
FIG. 9(b) is a longitudinal cross section view taken along a line 9(b)-9(b) in FIG. 9(a)
Figure 9C:
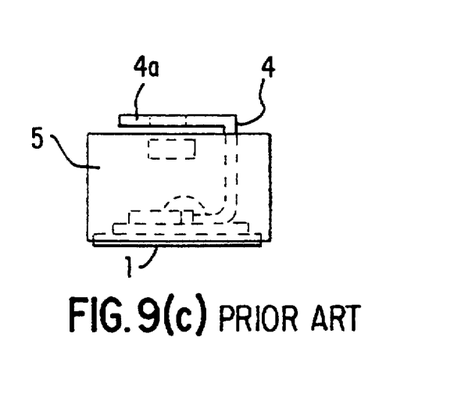
FIG. 9(c) is a side view of the semiconductor device as shown in FIG. 9(a)

The semiconductor device with such a structure is assembled in the following manner. First, the semiconductor chip (3) and the externally drawn terminal (4) which is not yet bent at this time are mounted on the metal base (1) to assemble a circuit assembly. Then, the outer casing (5) is placed via the insulating substrate (2) on the circuit assembly, which is bonded with the metal base (1), and filled with the molding resin (6) injected through a resin injection hole opened at the top of the outer casing (5), which is then hardened to seal the circuit assembly.

Figure 10:
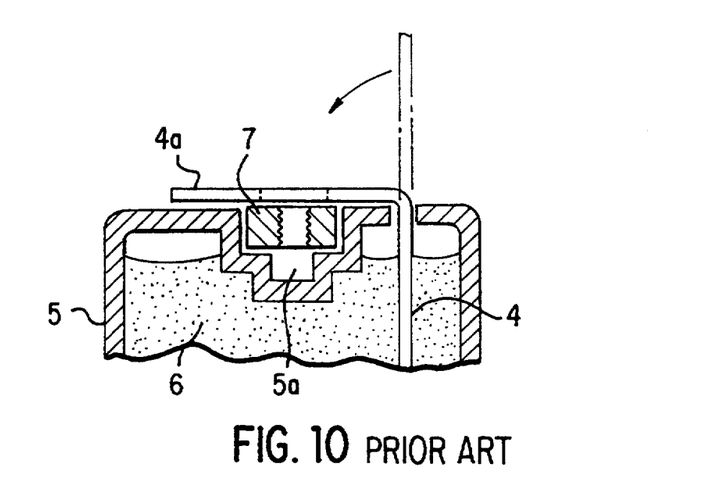
FIG. 10 is an enlarged cross section view taken along a line 10—10 in FIG. 9(a)

Thereafter, the terminal nut (7) is mounted on a recess (5a), which is a polygonal hole corresponding to the outer dimension of the terminal nut and formed on top of the outer casing (5), and a top portion of the externally drawn terminal (4) drawn out through the outer casing (5) is bent into an L shape from a straight state indicated by the chain lines in FIG. 10 to a position shown by solid lines, while an external wire connecting portion (4a) is superimposed on the terminal nut (7). Numeral (4b) is a hole drilled on the external wire connecting portion (4a) where a fixing screw is inserted.

The conventional terminal structure described above has the following problems because of a lack of mechanical strength of the semiconductor used.

Figure 11:
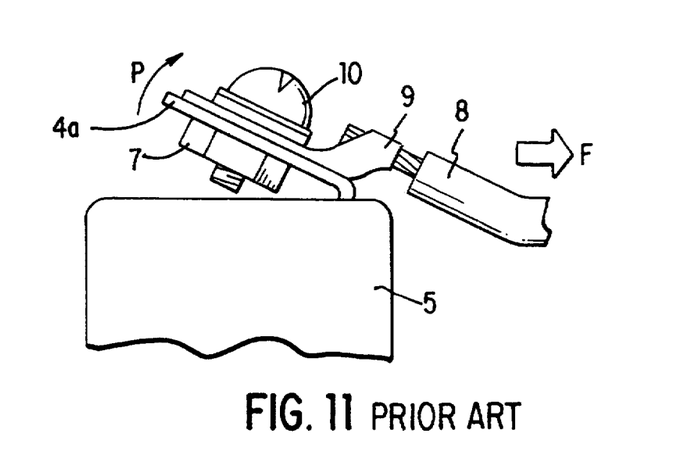
FIG. 11 is an explanatory side view for showing deformation of the externally drawn terminal when an external force acts on the terminal structure shown in FIG. 10.

That is, the externally drawn terminal with the external wire connecting portion on its tip drawn outwards from the outer casing through the molded resin layer in the casing is only supported by a single point. In case the large tensile external force shown by arrow F is imposed on an external wiring (8) when a connecting terminal metal part (9) of the external wiring (8) has been tightened by a screw (10) onto the external wire connecting portion (4a) as shown in FIG. 11, the tip of the externally drawn terminal (4) that has been bent into the L shape is pulled in a direction (P) and is deformed as shown, so that the terminal may be pulled out with the nut (7) from the outer casing (5) and floated upward.

Moreover, if a repeated load, such as vibration, is imposed on the semiconductor device for a long period of time while such a deformation is made on the externally drawn terminal (4), stress will be concentrated on the bent part of the externally drawn terminal (4) embedded in the module resin inside the outer casing and protruding outside the casing.

As a result, a breakage of the externally drawn terminal may happen at the bent part because of elastic fatigue, which can lead to a serious failure of the semiconductor device as it becomes impossible to energize the device.

The present invention has been made after considering these problems, with the intention of solving the problems on the externally drawn terminal of the resin-sealed semiconductor device described earlier, and provides a terminal structure for a resin-sealed semiconductor device with improved support strength against external force at the externally drawn terminal.

SUMMARY OF THE INVENTION

The above object can be achieved by forming the terminal structure in the following manner according to the present invention:

(1) An anchor that is bent downward is disposed on the tip of the externally drawn terminal to extend further from the external wire connecting portion. The anchor is fixed on the casing. The anchor may be fixed by inserting the tip of the anchor into the outer casing and embedding it in the resin layer, or forming the tip of the anchor integrally with the outer casing by embedding it in a case lid that has been formed as a resin mold independent of the outer casing.

(2) An auxiliary terminal metal part is inserted between the terminal nut and the external wire connecting portion in the externally drawn terminal. A leg of the auxiliary terminal metal part is fixed onto the outer casing. The auxiliary terminal metal part may be fixed by inserting the leg into the outer casing and embedding it in the molded resin, or fixing the leg on the outer casing.

(3) Fixing means to prevent the terminal nut from being pulled off is used on the terminal nut, the terminal nut being fixed on the outer casing by the fixing means. The auxiliary terminal metal part may be fixed by using an anchor that is an integral part of the nut and is provided below the terminal nut, the anchor being inserted into the outer casing and embedded in the molded resin layer. A wedge-like protrusion may be provided around the terminal nut, and the terminal nut is press-fitted and fixed in the recess of the outer casing.

In the above structure, the externally drawn terminal and the terminal nut, or the externally drawn terminal and the auxiliary terminal metal part are connected together by screwing the external wiring onto the externally drawn terminal by a fixing screw. At the same time, in the structure described in the foregoing paragraph (1), the anchor extending from the tip of the externally drawn terminal is fixed onto the casing, while in the structure described in the foregoing paragraph (2), the leg of the auxiliary terminal metal part is fixed onto the casing. In the structure described in the foregoing paragraph (3), the terminal nut is fixed onto the casing. Thus, the externally drawn terminal is supported by at least two points, thereby increasing the strength of the support.

Therefore, even if large tensile external force is imposed on the external wire connecting portion of the externally drawn terminal via the external wiring, undesirable deformation of the externally drawn terminal and floating from the outer casing can be prevented. Also, trouble, such as breakage of the externally drawn terminal, can be reliably prevented even if a repeated load, such as a vibration, is imposed.

DETAILED DESCRIPTION OF PREFERRED EMBODIMENTS

The embodiments of the present invention are described with reference to the accompanying drawings. In each embodiment, the parts identical to those in FIGS. 9 and 10 are given the same numerals.

Figure 1A:
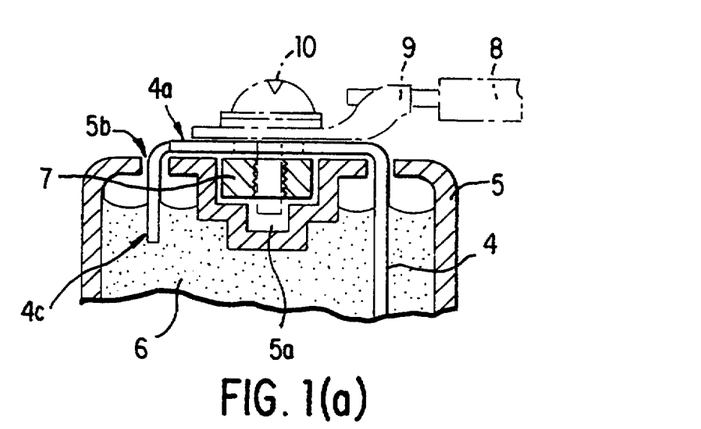
FIG. 1(a) is a cross section view of a terminal structure in an assembled condition of a first embodiment of the invention.
Figure 1B:
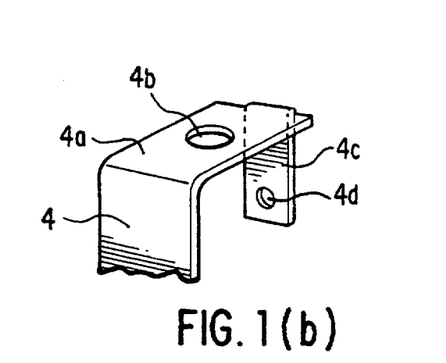
FIG. 1(b) is a perspective view of the externally drawn terminal as shown in FIG. 1(a)
Figure 1C:
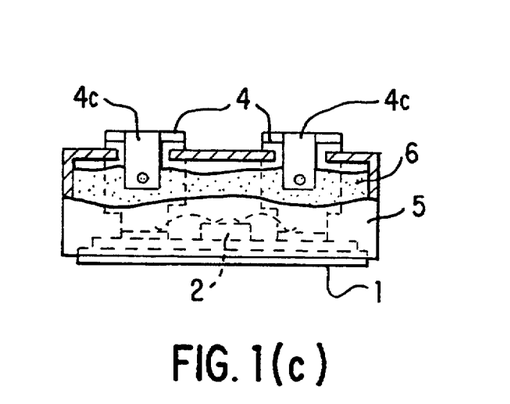
FIG. 1(c) is a structure of a resin-sealed semiconductor device employing the terminal structure shown in FIG. 1(a)

FIG. 1 shows a first embodiment of the invention, wherein an externally drawn terminal (4) drawn out from the top of an outer casing (5) through a molded resin layer (6) is provided with a tongue-like anchor (4c), which is bent to extend downwardly from an external wire connecting portion (4a). The anchor (4c) is inserted into the casing through a hole (5b) on the top of the outer casing (5), and the tip of the anchor (4c) is embedded and fixed in a molded resin (6). Numeral (4d) shows an anchoring hole drilled at the tip of the anchor (4c).

In case the above structure is assembled, after a circuit assembly is covered with the outer casing (5), the externally drawn terminal (4) protruding from the top of the outer casing (5) is bent in an inverted U-shape so that the external wiring connection (4a) and anchor (4c) are formed, with the tip of the anchor (4c) being inserted into the outer casing. Then, molding resin (6) used for sealing is injected and hardened. Thus, the rising part of the externally drawn terminal (4) and the anchor (4c) on the tip side are embedded and fixed in the molded resin layer.

By providing the anchoring hole (4d) on the anchor (4c), molding resin (6) is filled in this anchoring hole (4d), thereby increasing the bonding strength. This allows the externally drawn terminal (4) to be supported on two points, thus assuring a high support strength, and preventing trouble with the externally drawn terminal (4), such as excessive deformation or flotation from the casing, even if a large external tensile force is applied to the external wiring (8) screwed on the externally drawn terminal (4).

Figure 2:
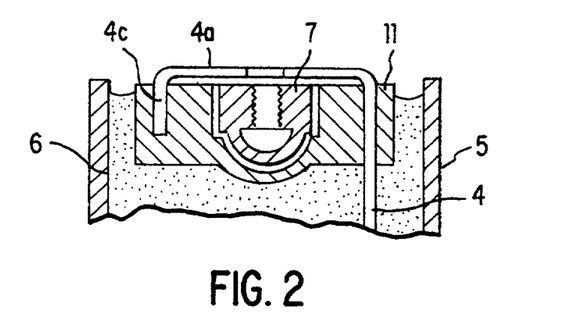
FIG. 2 is a cross section view of the terminal structure corresponding to a second embodiment of the present invention.

FIG. 2 shows a second embodiment of the present invention. In this embodiment, a case lid (11) made of resin is formed independently from the casing (5) and is provided on top of the casing. The anchor (4c) bent at the tip of the externally drawn terminal (4) is molded integrally with the case lid (11).

When the case lid (11) is formed, before the externally drawn terminal (4) is assembled with the circuit assembly, the external wire connecting portion (4a) and the anchor (4c) are bent. Then, the externally drawn terminal (4) and the terminal nut (7) are inserted into a mold and molding is made to form the case lid (11). A box nut is used as the terminal nut (7) to prevent the resin from entering into the screw hole during the molding process. The externally drawn terminal (4) formed integrally with the case lid (11) is integrated into the circuit assembly, and is covered with the outer casing (5). Then, the outer casing (5) is sealed with molding resin (6), which is hardened to secure the case lid (11).

This construction improves the supporting strength of the externally drawn terminal (4) to the same extent as that in the first embodiment described earlier. Moreover, such a structure makes it possible to bend the externally drawn terminal (4) prior to assemble with the circuit assembly, thus making the assembling efficiency higher than that in the first embodiment.

Figure 3A:
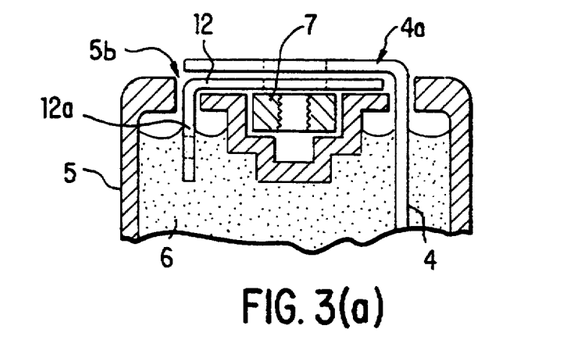
FIG. 3(a) is a cross section view of the terminal structure in an assembled condition of a third embodiment of the invention.
Figure 3B:
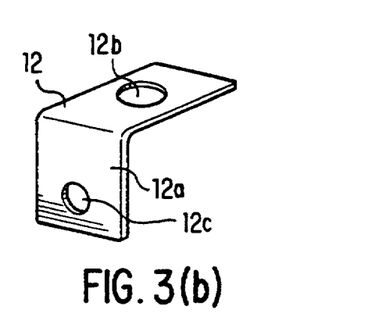
FIG. 3(b) is a perspective view of an auxiliary terminal metal part used in the third embodiment.

FIG. 3 shows a third embodiment of the present invention, wherein an auxiliary terminal metal part (12) which is bent into an L shape is inserted between the external wire connecting portion (4a) located on the top of the outer casing (5) and the terminal nut (7). A leg (12a) of the auxiliary terminal metal part (12) is inserted into the casing (5) through a hole (5b) at a position opposite to the externally drawn terminal, and fixed in the molding resin layer (6) therein. Numeral (12b) is a tightening screw inserting hole drilled at a portion where the terminal nut is superimposed, and numeral (12c) is an anchoring hole drilled on the tip of the leg (12a).

When the externally drawn terminal (4) is wired with external wires as shown in FIG. 11, the externally drawn terminal (4) and the auxiliary terminal metal part (12) are joined together by the tightening screw. Moreover, this structure, wherein the leg (12a) of the auxiliary terminal metal part (12) is embedded and fixed in the molded resin (6), serves to reinforce the externally drawn terminal (4) to the same extent as in the previously described embodiments. In case the auxiliary terminal metal part (12) is made of a spring plate, it serves to prevent the tightening screw screwed into the terminal nut (7) from becoming loose.

Figure 4A:
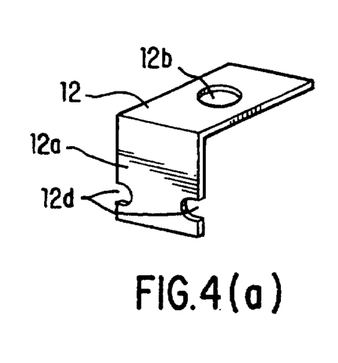
FIGS. 4(a)-4(e) are perspective views of different embodiments of the auxiliary terminal metal parts used in the third embodiment.
Figure 4B:
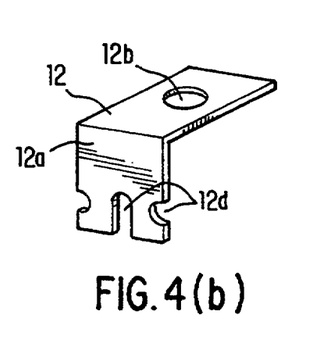
Figure 4C:
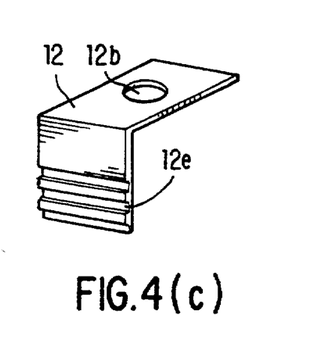
Figure 4D:
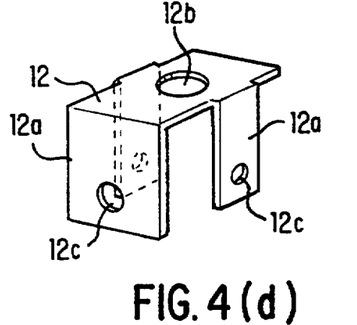
Figure 4E:
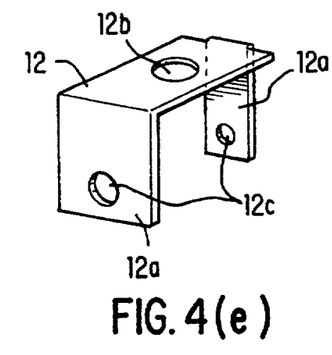

FIGS. 4(a) through 4(e) show variations of the auxiliary terminal metal parts (12) used in FIG. 3, wherein notches (12d) providing an anchoring effect equivalent to the anchoring hole 12c are formed in place of the anchoring hole (12c) in FIGS. 4(a) and 4(b), while irregular steps (12e) are formed in FIG. 4(c), and various legs (12a) are formed in FIGS. 4(d) and 4(e), each leg being provided with an anchoring hole (12c).

Figure 5A:
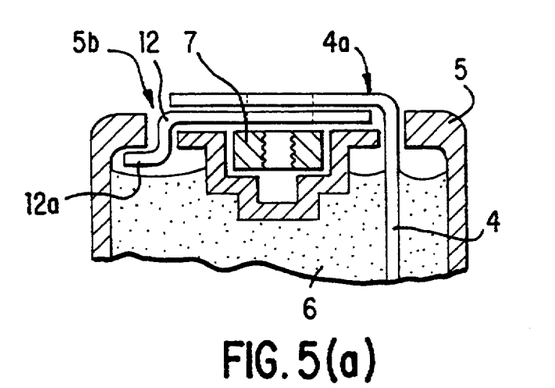
FIG. 5(a) is a cross section view of a terminal structure in an assembled condition of a fourth embodiment of the invention.
Figure 5B:
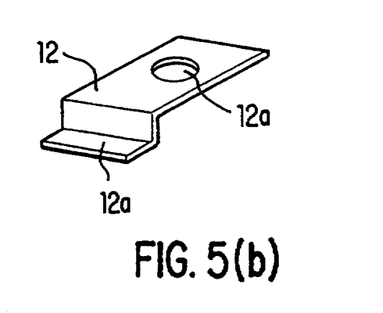
FIG. 5(b) is a perspective view of an auxiliary terminal metal part used in the fourth embodiment.

FIG. 5 shows a fourth embodiment, or a modified example of the third embodiment of the present invention, wherein the leg (12a) of the auxiliary terminal metal part (12) has been initially bent into a hook shape. The rear portion of the leg (12a) is inserted into an opening hole (5b) on the outer casing (5), and fixed to prevent the leg (12a) from falling off.

In this structure, the auxiliary terminal metal part (12) serves to reinforce the externally drawn terminal (4) to the same extent as in the previously described third embodiment. Moreover, since the auxiliary terminal metal part (12) can move slightly with respect to the outer casing (5), the positioning of the auxiliary terminal part (12) need not be controlled so carefully than in the third embodiment.

Figure 6:
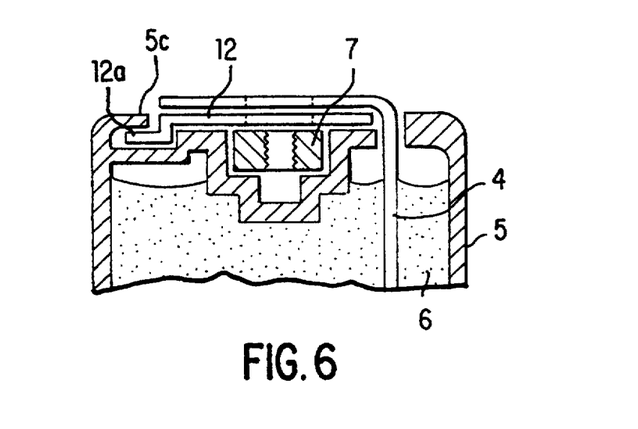
FIG. 6 is a cross section view of a terminal structure illustrating a modified embodiment shown in FIG. 5.

FIG. 6 shows another modification of the same type as described in FIG. 5, wherein a hook (5c) with a step to engage and fix with the leg (12a) of the auxiliary terminal metal part (12) is disposed on the upper edge of the outer casing (5). In this structure, the hook (5c) is completely separated from the molded resin (6) of the outer casing (5), so that the attachment of the auxiliary terminal metal part (12) is not disturbed by the molded resin (6).

Figure 7A:
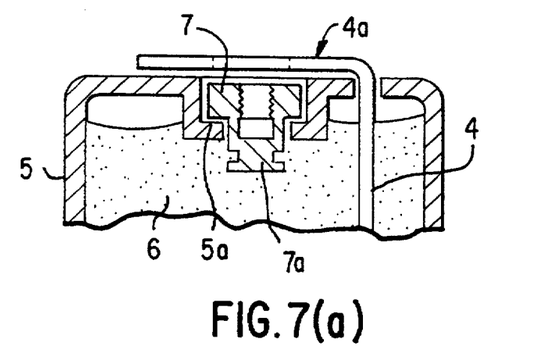
FIG. 7(a) is a cross section view of a terminal structure in an assembled condition of a fifth embodiment of the invention.
Figure 7B:
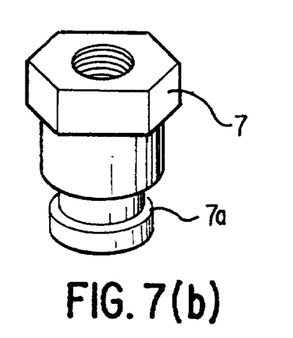
FIG. 7(b) is a perspective view of a terminal nut used in the fifth embodiment of the invention.

FIG. 7 shows a fifth embodiment of the present invention, wherein an anchor (7a) extending downward is formed at the terminal nut (7) mounted on a recess (5a) on top of the outer casing (5). To mount the terminal nut (7), the anchor (7a) is inserted into a bottom hole located in the recess (5a) of the outer casing (5), and is embedded and fixed in the molding resin (6) injected into the casing.

In such a structure, when the external wiring is screwed into the externally drawn terminal (4), as in FIG. 11, the external wire connecting portion (4a) exposed on top of the casing is connected to the terminal nut (7) by a tightening screw. In addition, since the terminal nut (7) is fixed into the molded resin (6) by the anchor (7a) as described earlier, the supporting strength of the externally drawn terminal is improved as in the case of the embodiments described above.

FIG. 8 shows a sixth embodiment or a modified example of the fifth embodiment of the present invention. In this embodiment, web-like protrusions (7b) as shown in FIGS. 8(a) and 8(b) or 8(c) and 8(d) are disposed on the circumference of the terminal nut (7), which is mounted in the recess (5a) of the outer casing (5). In the structure shown in FIGS. 8(a) and 8(b), inverted triangular cone-like protrusions are formed on each side of the hexagonal nut. In the structure, shown in FIG. 8(c) and 8(d), wedge-like protrusions (7b) are formed on thread-like teeth.

Figure 8A:
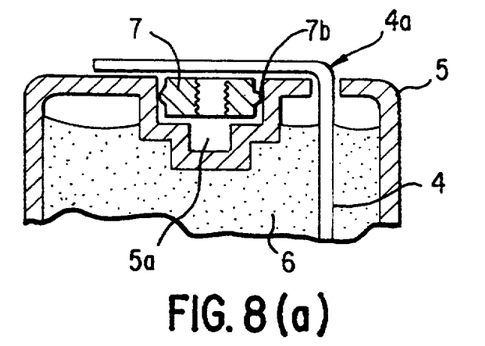
FIG. 8(a) is a cross section view of a terminal structure in an assembled condition of a sixth embodiment of the invention.
Figure 8B:
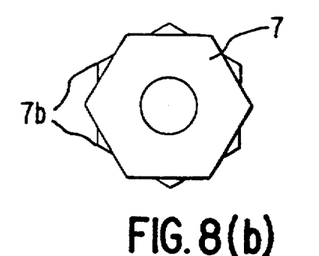
FIG. 8(b) is a plan view of a terminal nut used in the six embodiment.
Figure 8C:
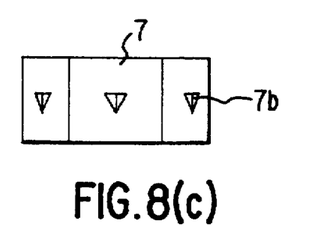
FIG. 8(c) is a side view of the terminal nut as shown in FIG. 8(b)
Figure 8D:
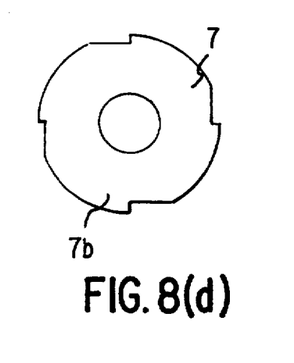
FIG. 8(d) is a plan view of a different terminal nut.
Figure 8E:
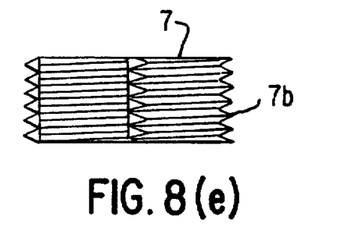
FIG. 8(e) is a side view of the terminal nut as shown in FIG. 8(d)

In such structures, when the terminal nut (7) is pushed or screwed into the recess (5a) in the outer casing (5), the wedge-like protrusions (7b) dig into the wall of the recess (5a) to fix the nut (7) securely to the outer casing (5). Therefore, even if external tensile strength is applied to the external wiring screwed on the externally drawn terminal (4), the externally drawn terminal (4), which is connected to the terminal nut (7) by the tightening screw can be prevented from floating up from the outer casing (5) and the terminal nut (7) can be prevented from coming off the recess (5a).

As described above, by using such terminal structures of the present invention, the externally drawn terminal can be reliably prevented from excessive deformation and from floating up from the outer casing, or from breaking due to a repeated load, such as vibration, even if great external tensile strength is applied to the external wiring screwed on the externally drawn terminal. As a result, the product reliability can be greatly improved.

While the invention has been explained with reference to the specific embodiments of the invention, explanation is illustrative, and the invention is limited only by the appended claims.

What is claimed is:

1. A terminal structure for a resin-sealed semiconductor device, comprising,
   a circuit assembly,
   an outer casing for housing the circuit assembly therein and having a lid with a recess for retaining a terminal nut therein,
   molding resin filled in the outer casing to seal the circuit assembly,
   an externally drawn terminal connected to the circuit assembly and extending outwardly through the outer casing, said externally drawn terminal having an external wire connecting portion disposed outside the lid, and
   an anchor integrally formed with the externally drawn terminal and extending from the external wire connecting portion toward the casing, said anchor being fixed to the casing so that the external wire connecting portion is fixed to the casing by two points.

2. A terminal structure for a resin-sealed semiconductor device as claimed in claim 1, wherein the anchor passes through the lid and is inserted inside the outer casing, said anchor being immovably embedded and fixed in the molding resin.

3. A terminal structure for a resin-sealed semiconductor device as claimed in claim 1, wherein said lid is formed separately from the outer casing and is fixed to the casing by the molding resin, said anchor being immovably fixed to the lid.

4. A terminal structure for a resin-sealed semiconductor device, comprising,
   a circuit assembly,
   an outer casing for housing the circuit assembly therein and having a lid with a recess for retaining a terminal nut therein,
   molding resin filled in the outer casing to seal the circuit assembly,
   an externally drawn terminal connected to the circuit assembly and extending outwardly through the outer casing, said externally drawn terminal having an external wire connecting portion disposed outside the lid, and an auxiliary terminal part contacting the external wire connecting portion and having a leg portion fixed to the outer casing so that when a fixing bolt for fixing a wire to the external wire connecting portion passes through the external wire connecting portion and the auxiliary terminal part and is engaged with the terminal nut, the external wire connecting portion is fixed to the casing through the fixing bolt by two points.

5. A terminal structure for a resin-sealed semiconductor device as claimed in claim 4, wherein the leg of the auxiliary terminal part passes through the outer casing and is embedded in the molding resin.

6. A terminal structure for a resin-sealed semiconductor device as claimed in claim 4, wherein the leg of the auxiliary terminal part is disposed and engaged in the outer casing.

7. A terminal structure for a resin-sealed semiconductor device as claimed in claim 6, wherein said outer casing has a hook separated from a portion where the molding resin is filled, said leg being inserted into the hook.

8. A terminal structure for a resin-sealed semiconductor device, comprising, a circuit assembly, an outer casing for housing the circuit assembly therein and having a lid with a recess, molding resin filled in the outer casing to seal the circuit assembly, an externally drawn terminal connected to the circuit assembly and extending outwardly through the outer casing, said externally drawn terminal having an external wire connecting portion disposed outside the lid, and a terminal nut situated in the recess of the lid and having fixing means to prevent the terminal nut from disengaging from the lid so that when a fixing bolt for fixing a wire to the external wire connecting portion is engaged with the terminal nut, the external wire connecting portion is fixed to the casing by the fixing bolt to thereby hold the external wire connecting portion by two points.

9. A terminal structure for a resin-sealed semiconductor device as claimed in claim 8, wherein said terminal nut includes an anchor integrally fixed below the terminal nut, said anchor passing through the lid and being embedded in the molding resin.

10. A terminal structure for a resin-sealed semiconductor device as claimed in claim -8, wherein said terminal nut includes wedge-like protrusions therearound, said terminal nut being press-fitted into the recess to be fixed to the outer casing.

* * * * *